United States Patent
Wong et al.

(10) Patent No.: US 9,508,795 B2
(45) Date of Patent: Nov. 29, 2016

(54) METHODS OF FABRICATING NANOWIRE STRUCTURES

(71) Applicant: GLOBALFOUNDRIES Inc., Grand Cayman (KY)

(72) Inventors: Chun Yu Wong, Ballston Lake, NY (US); Min-hwa Chi, Malta, NY (US); Ashish Baraskar, Clifton Park, NY (US); Jagar Singh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/613,983

(22) Filed: Feb. 4, 2015

(65) Prior Publication Data
US 2016/0225849 A1 Aug. 4, 2016

(51) Int. Cl.
 H01L 21/20 (2006.01)
 H01L 29/06 (2006.01)
 H01L 21/306 (2006.01)
 H01L 21/02 (2006.01)
 H01L 21/308 (2006.01)
 H01L 21/311 (2006.01)
 H01L 29/66 (2006.01)

(52) U.S. Cl.
 CPC ....... *H01L 29/0673* (2013.01); *H01L 21/0228* (2013.01); *H01L 21/02532* (2013.01); *H01L 21/02609* (2013.01); *H01L 21/308* (2013.01); *H01L 21/30608* (2013.01); *H01L 21/31116* (2013.01); *H01L 29/66795* (2013.01)

(58) Field of Classification Search
 USPC ....................................................... 438/478
 See application file for complete search history.

(56) References Cited

U.S. PATENT DOCUMENTS

2012/0138886 A1* 6/2012 Kuhn ............... B82Y 10/00 257/9
2015/0236051 A1* 8/2015 Loubet ............. H01L 27/1211 257/347

OTHER PUBLICATIONS

Davide Sacchetto, et.al. "Fabrication and Characterization of Vertically Stacked Gate-All-Around Si Nanowire FET Arrays", Proceedings of Europe Solid-state Device Research Conf. 2009 ESSDERC, 245-248, 2009.
C. Dupré, et.al. "15nm-diameter 3D Stacked Nanowires with Independent Gates Operation: FFET", IEDM, 2008.
Xuan Zuo, Tao Wang, Ricky M. Y. Ng, Jin He and Manslll Chan, "Cross-section Control of Stacked Nanowires formed by Bosch Process and Oxidation", INEC, 2010.
Marius Orlowski et al, "Si, SiGE, Ge, and III-V Semiconductor Nanomembranes and Nanowires Enabled by SiGe Epitaxy", ECS Transitions, 33 (6) 777-789 (2010), 10.1149/1.387608, The Electrochemical Society, 13 pages.

* cited by examiner

*Primary Examiner* — Timor Karimy
(74) *Attorney, Agent, or Firm* — Heslin Rothenberg Farley and Mesiti PC; Nicholas Mesiti

(57) ABSTRACT

Methods are presented for fabricating nanowire structures, such as one or more nanowire field effect transistors. The methods include, for instance: providing a substrate and forming a fin above the substrate so that the fin has a first sidewall including one or more elongate first sidewall protrusions and a second sidewall including one or more elongate second sidewall protrusions, with the one or more elongate second sidewall protrusions being substantially aligned with the one or more elongate first sidewall protrusions; and, anisotropically etching the fin with the elongate first sidewall protrusions and the elongate second sidewall protrusions to define the one or more nanowires. The etchant may be chosen to selectively etch along a pre-defined crystallographic plane, such as the (111) crystallographic plane, to form the nanowire structures.

19 Claims, 10 Drawing Sheets

METHODS OF FABRICATING NANOWIRE STRUCTURES

FIELD OF THE INVENTION

The present invention generally relates to fabricating circuit structures, and more specifically, to nanowire structures and methods of fabrication thereof.

BACKGROUND

Complementary metal oxide semiconductor (CMOS) technology is the primary technology employed for ultra-large scale integrated (ULSI) circuits. Over the past decades, reduction in the size of CMOS transistors, such as metal oxide semiconductor field-effect transistors (MOSFETs), has been a principle focus of the microelectronics industry. As transistors become smaller, the body thickness of the transistor (or thickness of the depletion layer below the inversion channel) must be scaled down to achieve superior short-channel performance.

In one class of CMOS transistors, a gate may be placed beneath the channel, as well as on top of the channel and its sides, to define a gate-all-around device, such as a gate-all-around MOSFET device. The gate-all-around configuration advantageously significantly increases the gate electrostatic control of the channel and the extent of the inversion layer. One type of gate-all-around device includes nanowire structures, in which one or more nanowires define the channel or channels of the FET and the gate is structured to wrap around each of the nanowires. However, fabrication of nanowire structures is challenging, and integration of nanowire fabrication techniques into integrated circuit fabrication processes continues to pose several difficulties.

SUMMARY OF THE INVENTION

The shortcomings of the prior art are overcome and additional advantages are provided through the provision, in one aspect, of a method including: forming one or more nanowires of a circuit structure, the forming including: providing a substrate; forming a fin above the substrate, the fin having a first sidewall and a second sidewall, the first sidewall including one or more elongate first sidewall protrusions extending for a length along the fin, and the second sidewall including one or more elongate second sidewall protrusions extending for at least the length along the fin, the one or more elongate second sidewall protrusions being substantially aligned with the one or more elongate first sidewall protrusions; and, anisotropically etching the fin with the elongate first sidewall protrusions and the elongate second sidewall protrusions to define the one or more nanowires.

Additional features and advantages are realized through the techniques of the present invention. Other embodiments and aspects are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
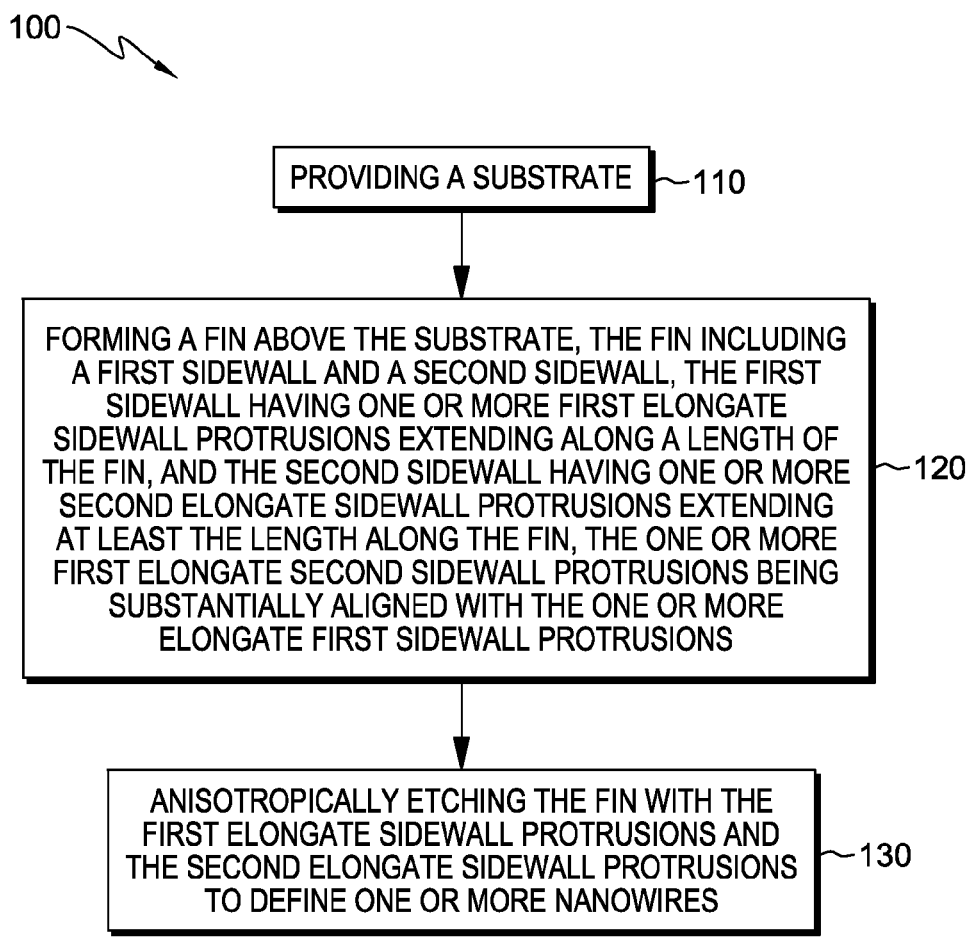
FIG. 1 outlines a process for forming one or more nanowires of a circuit structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Disclosed herein, at least in part, are methods of fabricating nanowire structures, such as nanowire MOSFETs (metal-oxide semiconductor field effect transistors). As used herein, a nanowire is an elongate nanostructure with, for instance, a diameter or thickness on the order of a few nanometers or less. Alternatively, a nanowire can be defined as an elongate structure having a thickness or diameter constrained to, for instance, ten nanometers or less, and an unconstrained length. By way of example, semiconductor devices are discussed herein using semiconducting nanowires. In one embodiment, the nanowires may be incorporated into transistors, such as metal oxide semiconductor field-effect transistors (MOSFETs). Advantageously, the processes disclosed herein may be compatible with complementary metal oxide semiconductor (CMOS) processing.

The nanowire field-effect transistor with a gate-all-around structure is of significant interest in the semiconductor industry due to, for example, its excellent gate controllability on the channel and minimized short channel effect. Controlling the shape and surface geometry of nanowires is of particular interest, as these properties may affect circuit structure properties and performance, such as band-gap size, contact area between the channel regions and gate structures, uniformity of channel region size and cross-sectional shape, and so on.

Thus, generally stated, disclosed herein is a method including: forming one or more nanowires of a circuit structure, the forming including: providing a substrate; forming a fin above the substrate, the fin having a first sidewall and a second sidewall, the first sidewall including one or more elongate first sidewall protrusions extending for a length along the fin, and the second sidewall including one or more elongate second sidewall protrusions extending for at least the length along the fin, the one or more elongate second sidewall protrusions being substantially aligned with the one or more elongate first sidewall protrusions; and, anisotropically etching the fin with the elongate first sidewall protrusions and the elongate second sidewall protrusions to define the one or more nanowires.

In exemplary embodiments, the anisotropic etching may include etching along a pre-defined crystallographic plane to remove portions of the fin and portions of the one or more elongate first sidewall protrusions and of the one or more elongate second sidewall protrusions that lie outside of the pre-defined crystallographic plane. The pre-defined crystallographic plane may, in exemplary embodiments, be a (111) crystallographic plane, so that the resulting one or more nanowires may be bound by (111) surfaces. The anisotropic etching may, for example, include etching with a wet etchant that preferentially etches along the pre-defined crystallographic plane, such as a hydroxide-based etchant. In one exemplary embodiment the etchant may include ammonium hydroxide. In another exemplary embodiment the etchant may include tetramethyl ammonium hydroxide (TMAH).

Reference is made below to the drawings, which are not drawn to scale for ease of understanding, wherein the same reference numbers used throughout different figures designate the same or similar components.

By way of summary, FIG. 1 illustrates one embodiment of a process 100 for forming one or more nanowires of a circuit structure, in accordance with one or more aspects of the present invention. In the embodiment illustrated, the process includes, for example: providing a substrate 110; forming a fin above the substrate, the fin having a first sidewall and a second sidewall, the first sidewall including one or more elongate first sidewall protrusions extending for a length along the fin, and the second sidewall including one or more elongate second sidewall protrusions extending for at least the length along the fin, the one or more elongate second sidewall protrusions being substantially aligned with the one or more elongate first sidewall protrusions 120; and, anisotropically etching the fin with the elongate first sidewall protrusions and the elongate second sidewall protrusions to define the one or more nanowires 130.

FIGS. 2A-2J illustrate one exemplary embodiment of a process for forming nanowires of a circuit structure. The resulting nanowires may have surfaces bounded by a (111) crystallographic plane (i.e., the nanowires have a diamond-shaped cross-sectional profile). The process generally includes masking a first portion of a substrate with a masking material, leaving a second portion of the substrate exposed, and recessing the second portion of the substrate to leave the first portion as a fin. The recessing further forms a plurality of elongate first trenches in a first part of a first sidewall of the fin and a plurality of elongate second trenches in a first part of a second sidewall of the fin, the plurality of elongate first trenches and the plurality of elongate second trenches being co-planar and extending along the length of the fin. The second part of the first sidewalls comprise the one or more elongate first sidewall protrusions, and the second part of the second sidewalls comprise the one or more elongate second sidewall protrusions.

Figure 2A:
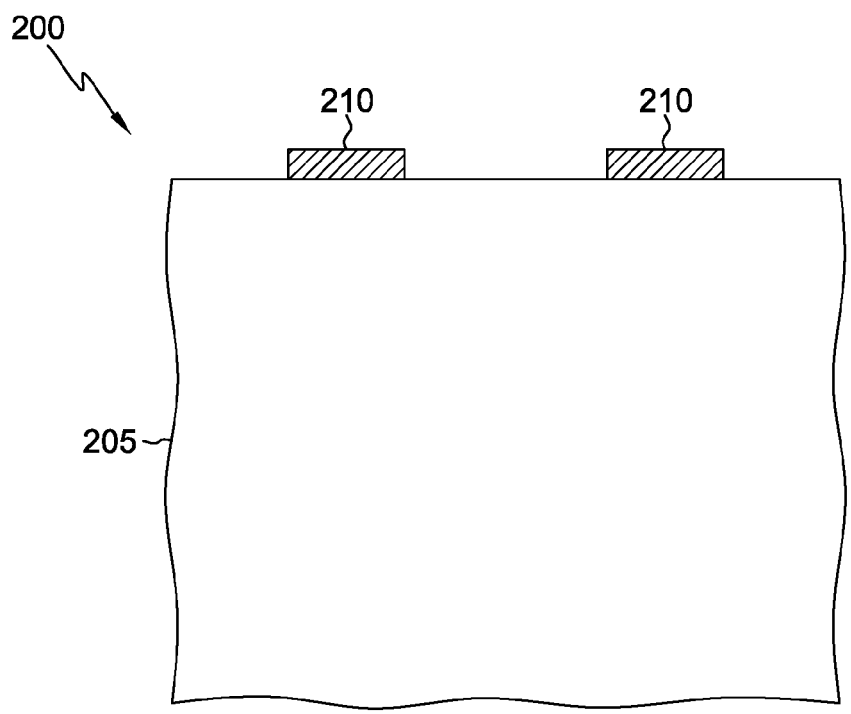
FIGS. 2A-2J depict one embodiment of at least part of a process for forming one or more nanowires of a circuit structure, in accordance with one or more aspects of the present invention herein.

FIG. 2A depicts a cross-sectional view of one embodiment of a structure 200 including a substrate 205, which may be, for example, a silicon wafer or similar semiconductor substrate. A masking material 210, such as silicon nitride, may be provided over a first part of substrate 205, the masking material leaving a second part of substrate 205 exposed.

Figure 2B:
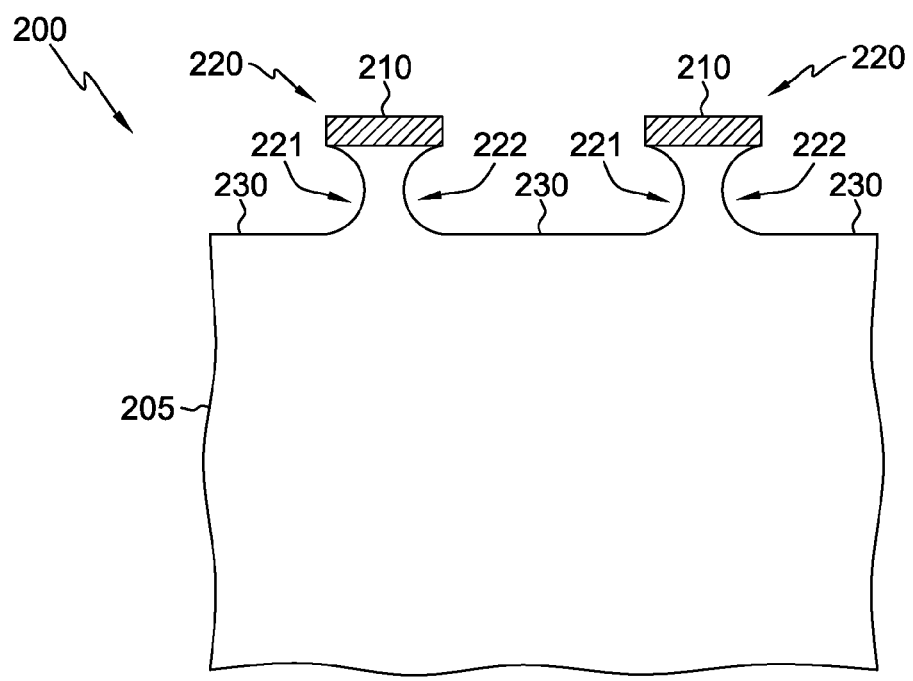

FIG. 2B depicts structure 200 of FIG. 2A following etching of the exposed second portion of the substrate. The etching may be an isotropic etching process, such as a plasma etching process, resulting in recession of upper surfaces 230 of substrate 205 and leaving the masked first portion of the substrate below masking material 210 as one or more fins 220. The isotropic etching process may also partially remove some material of fin 220, forming one elongate first trench 221 along a first sidewall of fin 220 and one elongate second trench 222 along a second sidewall of fin 220.

Figure 2C:
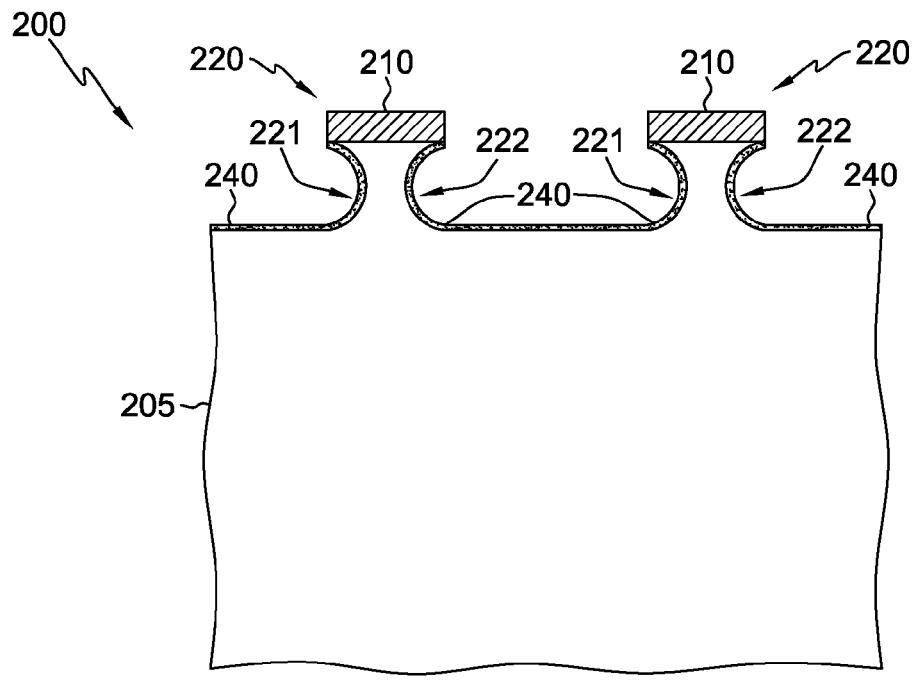
Figure 2D:
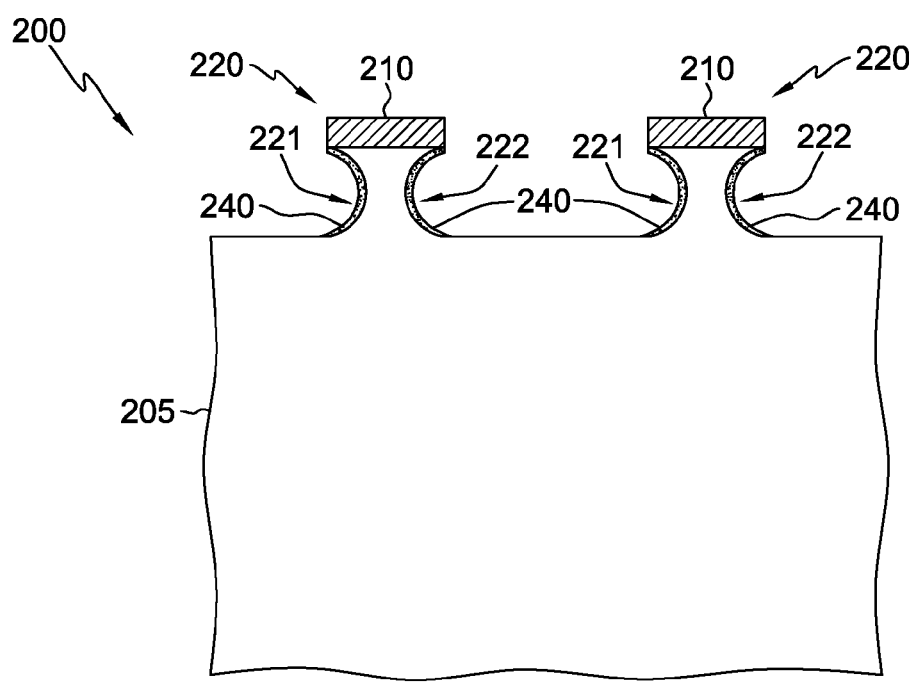

FIG. 2C depicts structure 200 of FIG. 2B following deposition of a passivating material 240 over the recessed second portion of substrate 205 and the one elongate first trench 221 and the one elongate second trench 222 of fin 220. The passivating material 240 may, for example, include a fluorocarbon (e.g., $C_XF$). FIG. 2D depicts structure 200 of FIG. 2C following a selective etching process, such as an anisotropic etching process, that removes passivating material 240 from over substrate 205 while leaving the passivating material 240 over the one elongate first trench 221 and one elongate second trench 222.

Figure 2E:
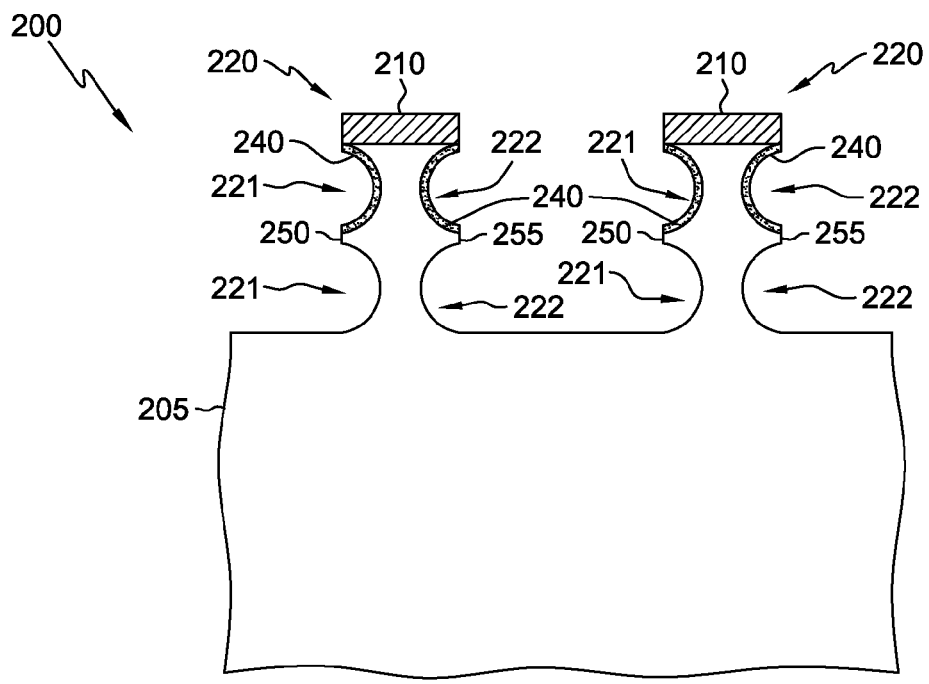
Figure 2F:
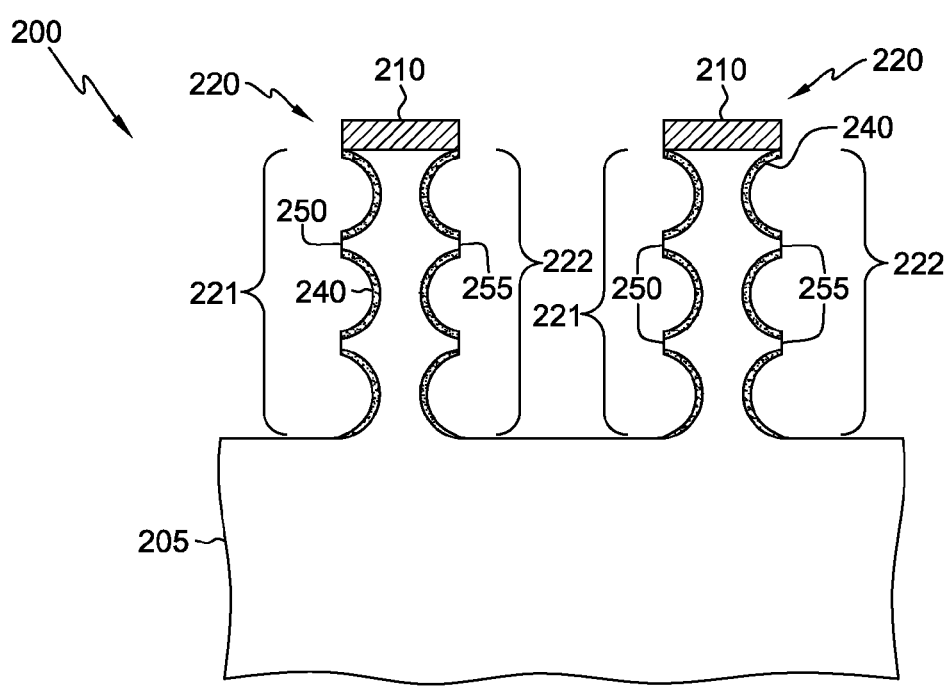

FIGS. 2B, 2C, and 2D together depict one embodiment of an etching cycle that may be used, at least in part, to form a fin or fins 220 having a plurality of elongate first sidewall protrusions 250 and elongate second sidewall protrusions 255. As illustrated in FIG. 2E, additional etching cycles, for example additional cycles similar to the cycle depicted in FIGS. 2B-2D, may be performed to form additional elongate first trenches 221 and elongate second trenches 222 in first parts of fins 220. The second part(s) 250 of the first sidewall of fin 220, between the plurality of elongate first trenches 221, forms one of the one or more elongate first sidewall protrusions 250, while the second part(s) 255 of the second sidewall of fin 220, between the plurality of elongate second trenches 222, forms the one or more elongate second sidewall protrusions 255. Passivating material 240 may remain in place over already formed elongate trenches 221, 222 to prevent further etching of the elongate trenches during the additional etching cycles. As illustrated by FIG. 2F, several additional etching cycles may be carried out to result in a fin 220 having a plurality of elongate first protrusions 250 and a plurality of elongate second protrusions 255. The number of etching cycles may be controlled to control the number of elongate protrusions 250, 255.

Figure 2G:
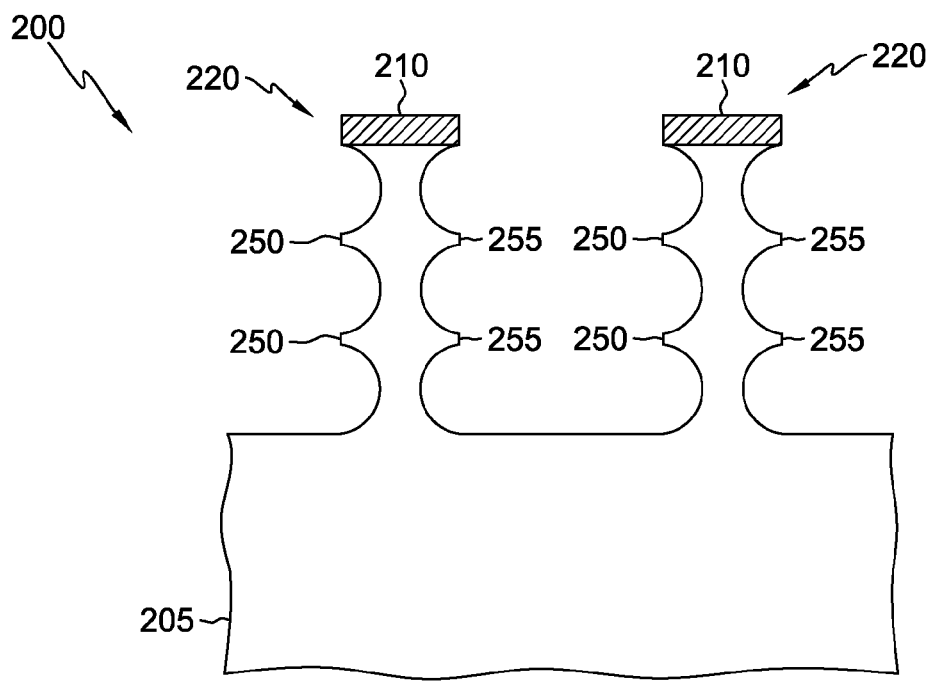
Figure 2H:
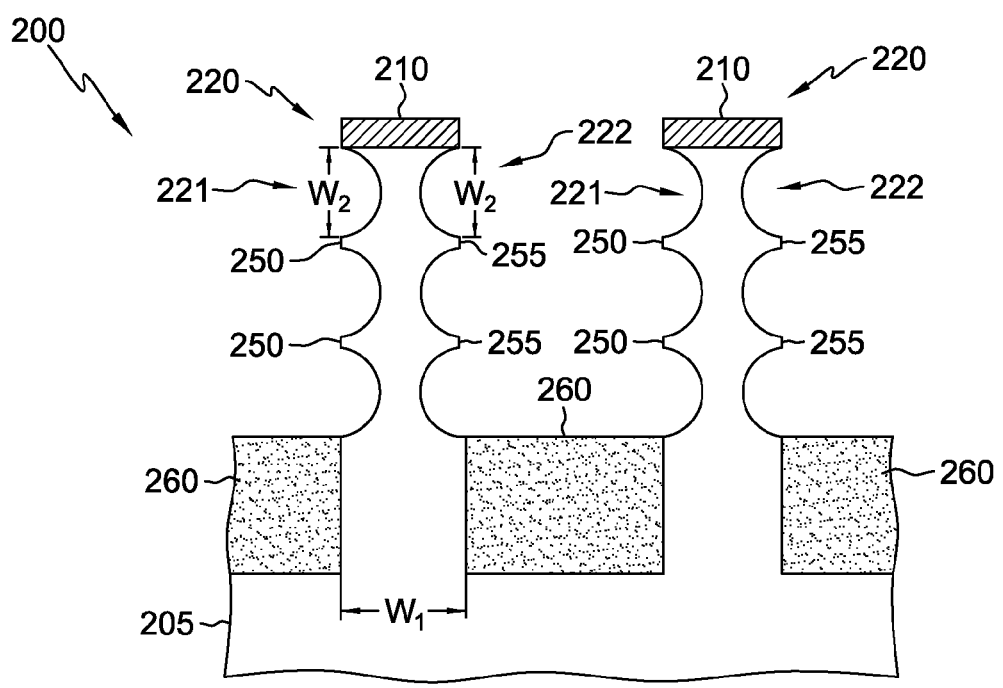

FIG. 2G depicts the structure 200 of FIG. 2F following removal of the passivating material from over fin 220, leaving a fin 220 having a plurality of elongate first protrusions 250 and a plurality of elongate second protrusions 255. FIG. 2H illustrates the structure 200 of FIG. 2G with STI isolation structure, i.e. a recess of the second portion of substrate 205 and filled with a dielectric material 260 over the second portion of substrate 205 (by deposition of dielectric 260 to a level above 210, then CMP for planarization, and then plasma etching to reveal the fin to desired depth). Dielectric material 260 may be, for example, silicon dioxide or silicon nitride, or in general any material capable of protecting substrate 205 from an etchant used to etch fins 220, as described further below. As FIG. 2H further illustrates, the fin 220 may have a width $W_1$ and the plurality of elongate first trenches 221 and plurality of elongate second trenches 222 may have a width $W_2$ different from $W_1$. The difference between $W_1$ and $W_2$ may affect the formation of nanowires from fin 220, as described further below.

Figure 2I:
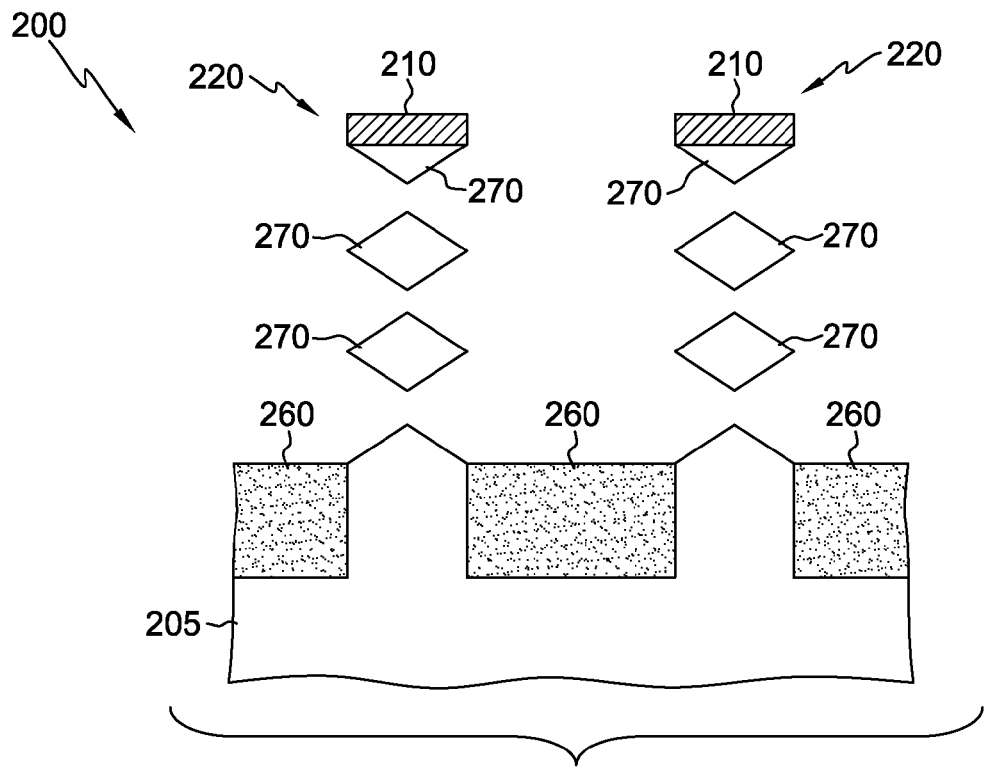

FIG. 2I depicts one embodiment of structure 200 from FIG. 2H following anisotropically etching fin 220 and elongate first sidewall protrusions 250 and elongate second sidewall protrusions 255 to define the one or more nanowires 270. As FIG. 2I illustrates, the anisotropic etching may remove portions of the fin and portions of the elongate first sidewall protrusions and elongate second sidewall protrusions along a pre-defined crystallographic plane to form nanowires 270. In exemplary embodiments, the crystallographic plane may be a (111) crystallographic plane, so that the resulting nanowires have a diamond-shaped cross-sectional profile, as illustrated by FIG. 2I. The anisotropic etching may include use of an anisotropic wet etchant. Anisotropic wet etchants such as hydroxide-based etchants (e.g., ammonium hydroxide, tetramethyl ammonium hydroxide or TMAH, etc.) may selectively etch along the (111) crystallographic plane, so that portions of fin 220 and elongate sidewall protrusions 250, 255 that lie outside the (111) crystallographic plane are etched at a relatively rapid rate while material bound by the (111) crystallographic plane may be etched at a much slower rate, or may remain substantially unetched as a self-limiting process. The etch rate of material outside the (111) crystallographic plane may, for example, be about ten times faster than the etch rate of material bound by the (111) crystallographic plane. FIG. 2I depicts nanowires 270 formed from one fin as being vertically separated from one another and from substrate 205. This may occur in exemplary embodiments in which the fin 220, as depicted in FIG. 2H for example, has a width $W_1$ smaller than width $W_2$ of the plurality of elongate first trenches 221 and plurality of elongate second trenches 222. The anisotropic wet etching may then continue etching the material of fin 220 and elongate protrusions 250, 255 so that no material remains between nanowires 270 to allow physical contact between the nanowires, resulting in completely vertically separated nanowires 270.

Figure 2J:
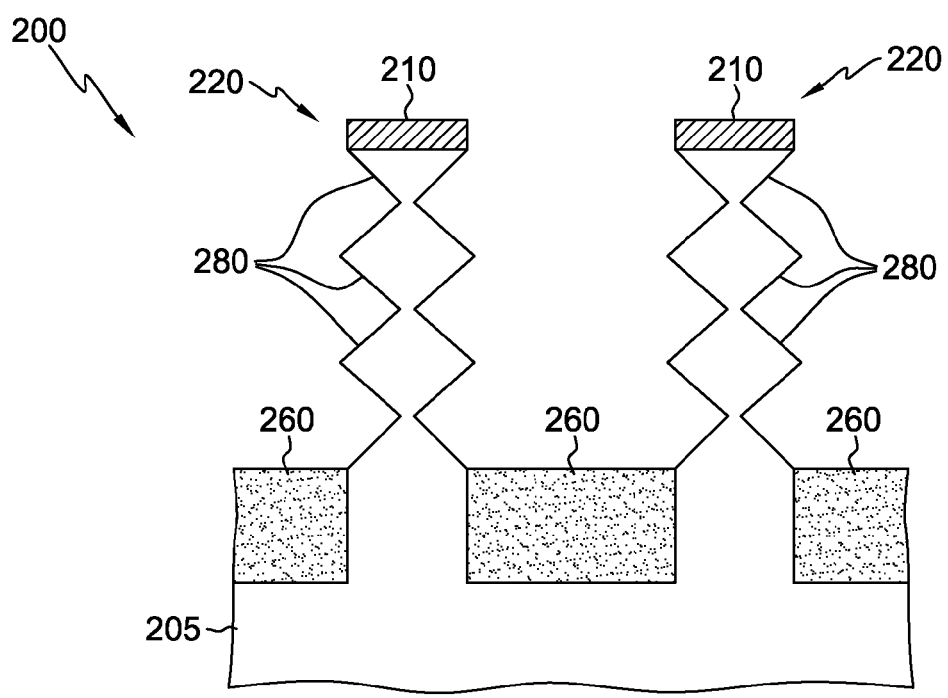

FIG. 2J depicts an alternative embodiment of structure 200 from FIG. 2H following anisotropic etching of fin 220 and elongate first sidewall protrusions 250 and elongate second sidewall protrusions 255 to define the one or more nanowires 280. The anisotropic wet etching may proceed as described above for FIG. 2I. The nanowires 280 in FIG. 2J, however, may contact one another and may contact substrate 205. This may occur, as depicted in FIG. 2H for example, in alternative exemplary embodiments in which the fin 220 has a width $W_1$ larger than width $W_2$ of the plurality of elongate first trenches 221 and plurality of elongate second trenches 222. In such exemplary embodiments, the anisotropic etching may terminate before completely etching the material of fin 220, allowing for vertical contact between the nanowires 280 and between nanowires 280 and substrate 205. The nanowires 280 in vertical contact may alternatively be described as a "zig-zag fin" rather than as nanowires. The "zig-zag fin" may be a desirable configuration for several types of transistor structures in which a fin, rather than one or more separated nanowires, defines the channel region of a gate structure for the transistor. The "zig-zag" sidewalls of the fin may, for example, provide a greater contact area between the fin and the gate structure, while still retaining the vertical fin structure desired.

FIGS. 3A-3H illustrate an alternative exemplary embodiment of a process for forming nanowires of a circuit structure resulting in nanowires having surfaces bounded by a (111) crystallographic plane. The process generally includes forming at least one first material layer and at least one second material layer above the substrate; etching a plurality of trenches through the at least one first material layer and at least one second material layer, resulting in the formation of a fin having a plurality of first material sidewalls and a plurality of second material sidewalls; and forming elongate first sidewall protrusions and elongate second sidewall protrusions along the plurality of first material sidewalls.

Figure 3A:
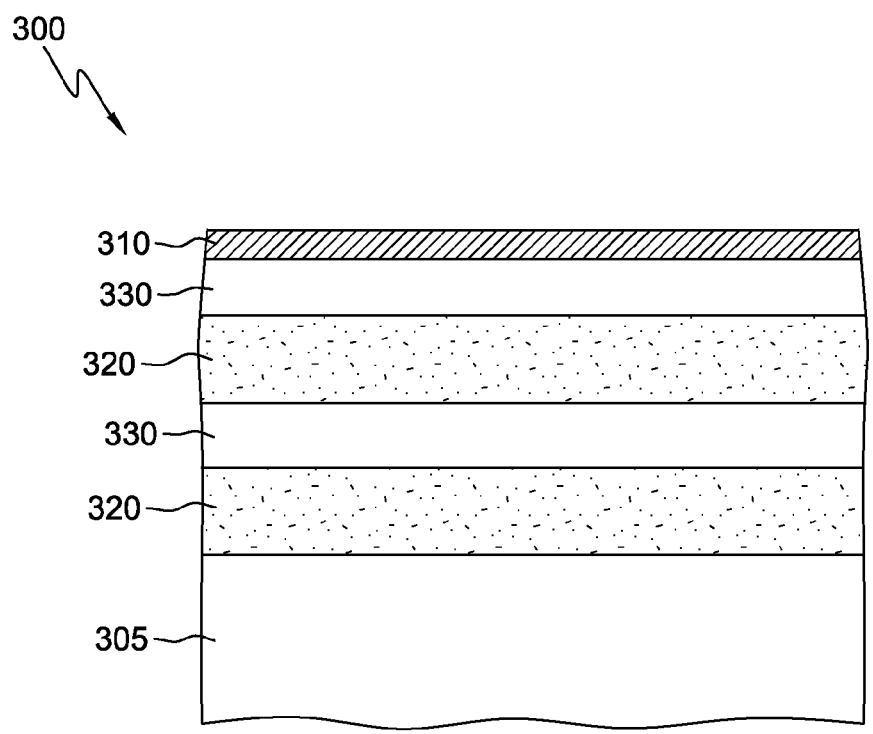
FIGS. 3A-3H depict an alternative embodiment of at least part of a process for forming one or more nanowires of a circuit structure, in accordance with one or more aspects of the present invention.

FIG. 3A depicts a cross-sectional view of one embodiment of a structure 300 including a substrate 305, which may be a silicon wafer or similar semiconductor substrate, at least one first material layer 320 and at least one second material layer 330 above substrate 305. A masking material 310, such as silicon nitride, may be provided over structure 300. Masking material 310 may be patterned to allow for etching through first and second material layers 320, 330 so as to form one or more fins from the first and second material layers. The first material layer 320 or layers may be, for example, a silicon-germanium layer. The second material layer 330 or layers may be, for instance, a silicon layer.

Figure 3B:
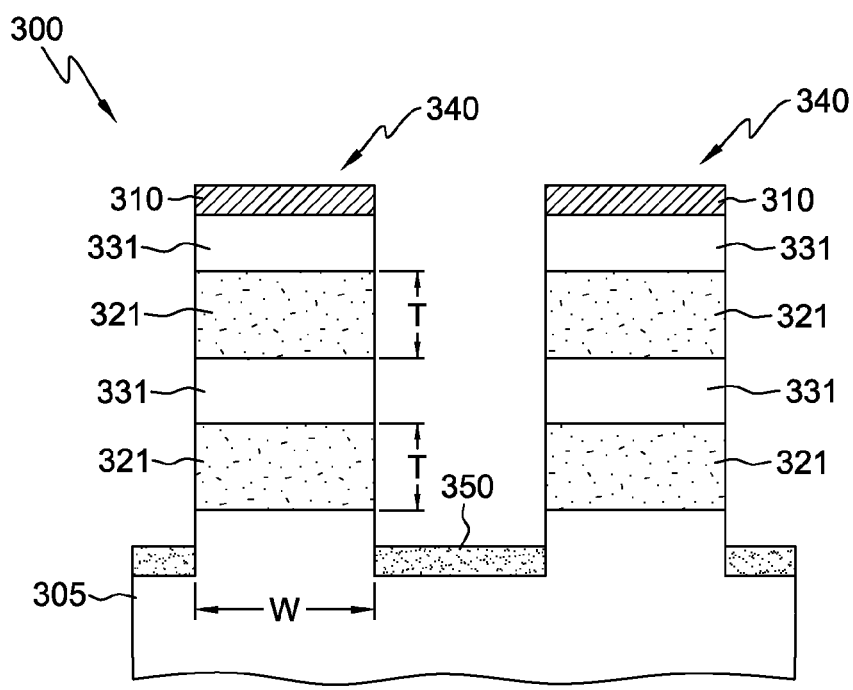

FIG. 3B depicts structure 300 of FIG. 3A following etching of a plurality of trenches through the at least one first material layer 320 and the at least one second material layer 330, resulting in fin(s) 340. Fin 340 has a plurality of first material sidewalls corresponding to first material layers 321, and a plurality of second material sidewalls corresponding to second material layers 331. A dielectric material 350 may be provided over the exposed upper surfaces of substrate 305 to protect portions of substrate 305 from subsequent etching or growth processes. As illustrated by FIG. 3B, fin 340 may have a width W and the at least one first material layer 320 may have a thickness T. The difference between W and T may affect the formation of nanowires from fin 340, as described further below.

Figure 3C:
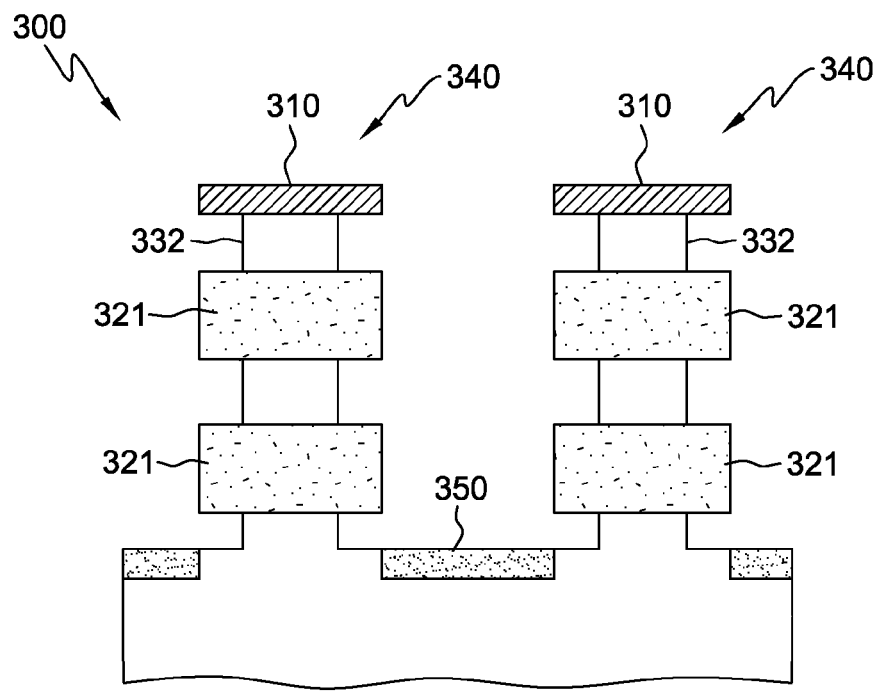

FIG. 3C depicts structure 300 of FIG. 3B following a selective lateral etch of the plurality of second material sidewalls 331 of fin 340 to undercut the plurality of first material sidewalls 321 and expose inner portions 332 of the at least one second material layer. The lateral etching process may, for example, be a process that selectively etches the material of the at least one second material layer without significantly etching the material of the at least one first material layer. For example, if first material layers 321 include silicon-germanium and second material layers 331 include silicon, then the lateral etch may include selectively etching with an etchant that preferentially etches silicon and to which silicon-germanium is etch-resistant, such as $CF_4/O_2/N_2$ gas etchant in one example. Alternatively, if first material layers 321 include silicon and second material layers 331 include silicon-germanium, the lateral etch may include selectively etching with an etchant that preferentially etches silicon-germanium and to which silicon is etch-resistant, such as HCl wet etchant in one example or $HF/HNO_3/CH_3COOH$ wet etchant in another example.

Figure 3D:
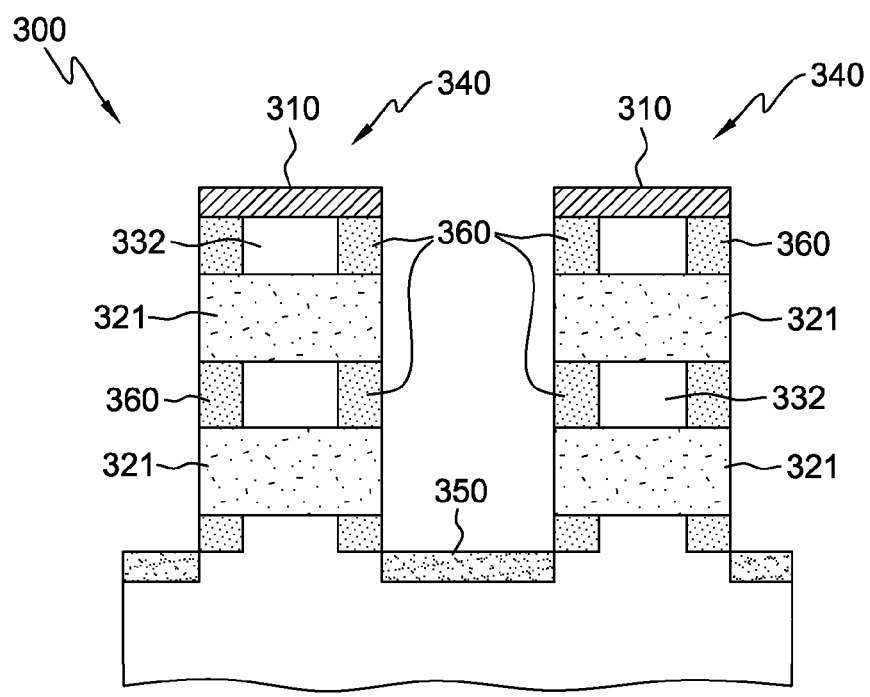

FIG. 3D depicts structure 300 of FIG. 3C following deposition of a passivating material 360, which covers the exposed inner portions 332 of the at least one second material layer of fin 340. Passivating material 360 may be deposited, for example, via atomic layer deposition (ALD) processes, and may include, for example, an oxide-based passivating compound. Passivating material 360 may be provided, for example, to facilitate growth of a material on first material sidewalls 321, as described below, by preventing unwanted growth of the material on second material sidewalls. As illustrated by FIG. 3D, passivating material 360 may ideally fill the undercuts of the plurality of first material sidewalls 321 without extending beyond the plurality of first material sidewalls 321. Depending on the parameters of the process used to deposit passivating material 360, a portion of passivating material 360 may initially extend beyond first material sidewalls 321. This portion of passivating material 360 may be selectively etched so that passivating material 360 does not extend beyond first material sidewalls 321. For instance, an anisotropic plasma etch configured to selectively etch passivating materials, such as oxide-based passivating compounds, may facilitate removal of the passivating material 360 extending beyond first material sidewalls 321.

Figure 3E:
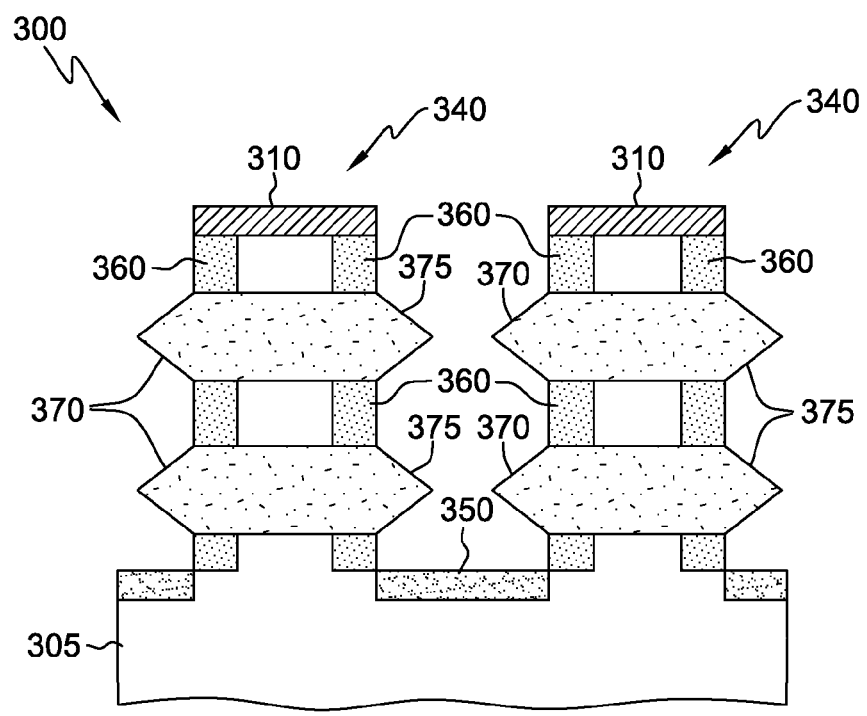
Figure 3F:
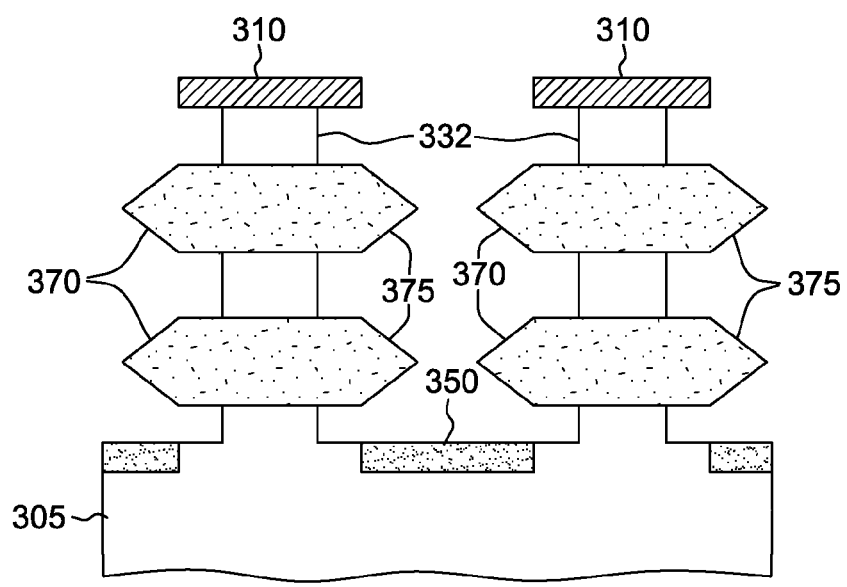

FIG. 3E depicts structure 300 of FIG. 3D following formation of elongate first sidewall protrusions 370 and elongate second sidewall protrusions 370 along the plurality of first material sidewalls of fin 340. Elongate first sidewall protrusions 370 and elongate second sidewall protrusions 370 may be formed, in exemplary embodiments, via epitaxial growth of the first material on the plurality of first material sidewalls. Epitaxial growth of the first material may, as in the exemplary embodiment depicted by FIG. 3E, result in the elongate first sidewall protrusions 370 and elongate second sidewall protrusions 375 having one or more exterior surfaces defined by a (111) crystallographic plane. Passivating material 360 may prevent growth of the first material on the at least one second material layer 331, and may also prevent significant growth of the first material on the passivating material 360 itself. FIG. 3F depicts structure 300 of FIG. 3E following removal of passivating material 360, exposing the at least one second material layer 331. Passivating material 360 may be removed by any process that can preferentially remove the passivating material 360 without affecting first material layer 321, second material layer 331, substrate 305 or dielectric material 350. Passivating material 360 may, in one exemplary embodiment, include a nitride of Flurin-contained polymer, which may be selectively removed by, for instance, a wet clean process including $H_3PO_4$ or diluted HF.

Figure 3G:
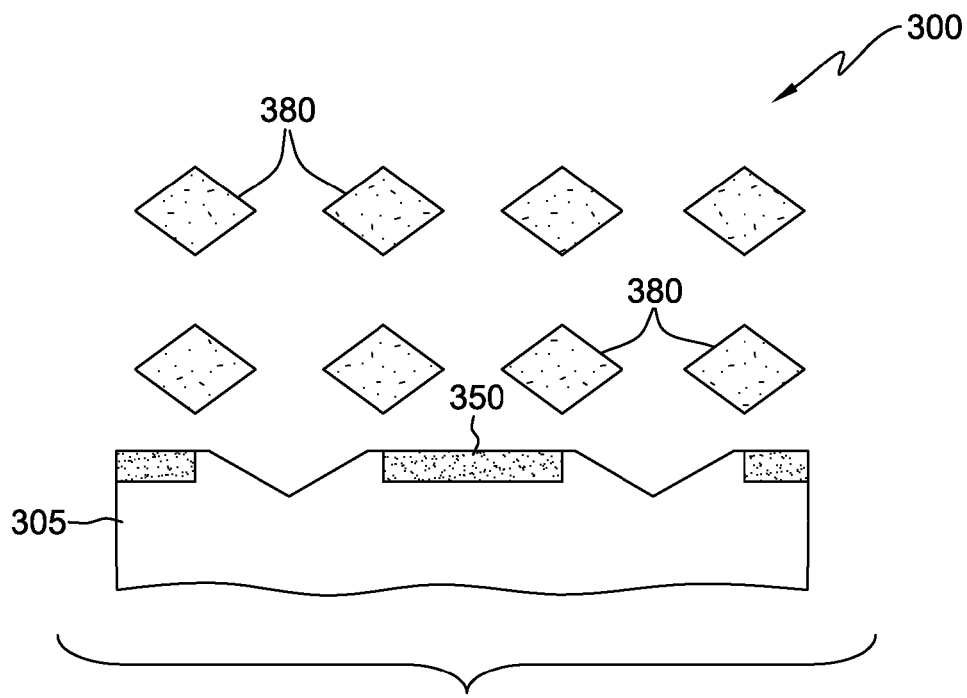

FIG. 3G depicts one embodiment of structure 300 from FIG. 3F following anisotropically etching fin 340 and elongate first sidewall protrusions 370 and elongate second sidewall protrusions 375 to define the one or more nanowires 380. As FIG. 3G illustrates, the anisotropic etching may remove portions of the fin 340, including the at least one second material layer 331, and portions of the elongate first sidewall protrusions 370 and elongate second sidewall protrusions 375 along a pre-defined crystallographic plane to form nanowires 380. In exemplary embodiments, the crystallographic plane may be a (111) crystallographic plane, so that the resulting nanowires have a diamond-shaped cross-sectional profile, as illustrated by FIG. 3G. Anisotropic wet etchants such as hydroxide-based etchants (e.g., ammonium hydroxide, tetramethyl ammonium hydroxide or TMAH, etc.) may selectively etch along the (111) crystallographic plane, so that portions of fin 340 and elongate sidewall protrusions 370, 375 that lie outside the (111) crystallographic plane are etched at a relatively rapid rate while material bound by the (111) crystallographic plane may be etched at a much slower rate, or may remain substantially unetched as a self-limiting process. The etch rate of material outside the (111) crystallographic plane may, for example, be about ten times faster than the etch rate of material bound by the (111) crystallographic plane. FIG. 3G depicts at least two nanowires 380 being formed from one first material layer of fin 340 as a result of the anisotropic etching. This may occur in exemplary embodiments in which the fin 340, as depicted in FIG. 3B, initially has a width W and the at least one first material layer 321 has a thickness T smaller than width W. The anisotropic etching process may then continue etching the at least one first material layer 321 until two separate nanowires 380, each with surfaces bound by the (111) crystallographic plane, have been formed.

Figure 3H:
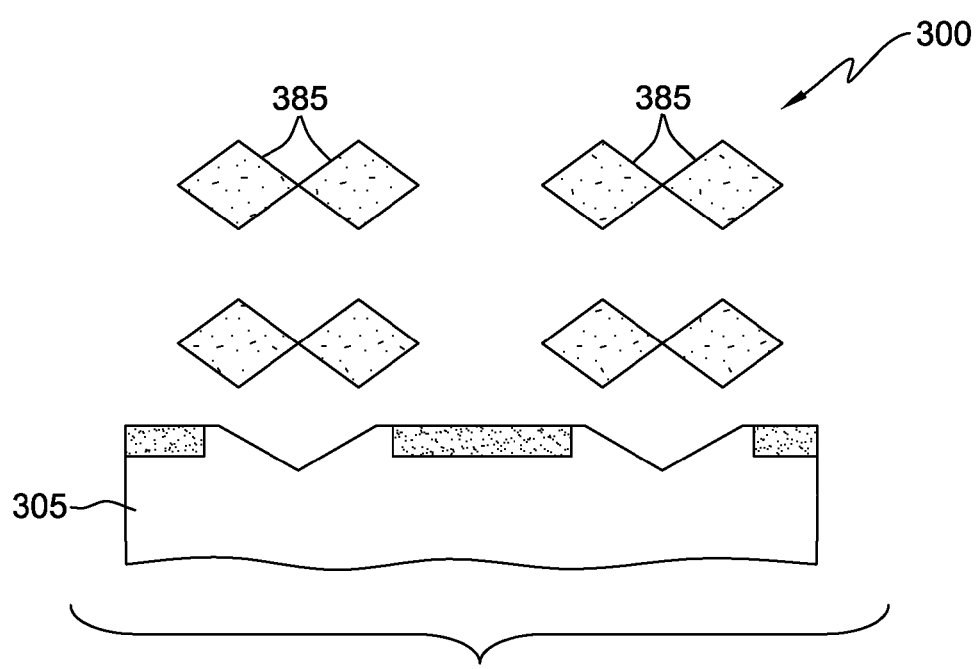

FIG. 3H depicts an alternative embodiment of structure 300 from FIG. 3F following anisotropically etching fin 340 and elongate first sidewall protrusions 370 and elongate second sidewall protrusions 370 to define the one or more nanowires 380. The anisotropic etching may proceed as described above for FIG. 3G. The nanowires 380 in FIG. 3H, however, may be substantially horizontally aligned and may be in horizontal contact with each other. This may occur in alternative exemplary embodiments, for example, in which fin 340, as depicted in FIG. 3B, initially has a width W and the at least one first material layer 321 has a thickness T larger than width W. The anisotropic etching may terminate before completely etching the material of the at least one first material layer, as in the example depicted in FIG. 3G. The resulting nanowires formed from the at least one first material layer may thus not be completely separated and may maintain contact with each other. Such nanowires as depicted in the example of FIG. 3H may alternatively be described as a single "twin" nanowire.

The processes described in FIGS. 2A-2J and FIGS. 3A-3H represent just two exemplary processes for forming fins having a plurality of first sidewall protrusions and a plurality of second sidewall protrusions, allowing for use of an etchant that may then selectively etch the fin and the plurality of protrusions to form nanowires having surfaces defined by a (111) crystallographic plane. Those with skill in the art will appreciate that other alternative processes may form a fin having a plurality of first sidewall protrusions and a plurality of second sidewall protrusions, and that such processes are contemplated within the scope of the present invention.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A method comprising:
    forming one or more nanowires of a circuit structure, the forming comprising:
        providing a substrate;
        forming a fin above the substrate, the fin comprising a first sidewall and a second sidewall, the first sidewall comprising one or more elongate first sidewall protrusions extending for a length along the fin, and the second sidewall comprising one or more elongate second sidewall protrusions extending for at least the length along the fin, the one or more elongate second sidewall protrusions being substantially aligned with the one or more elongate first sidewall protrusions; and
        anisotropically etching the fin with the elongate first sidewall protrusions and the elongate second sidewall protrusions to define the one or more nanowires wherein the anisotropically etching comprises etching along a pre-defined crystallographic plane to remove portions of the fin and portions of the one or more elongate first sidewall protrusions and of the one or more elongate second sidewall protrusions outside of the pre-defined crystallographic plane.

2. The method of claim 1, wherein the pre-defined crystallographic plane comprises a (111) crystallographic plane.

3. The method of claim 1, wherein the anisotropically etching further comprises wet etching with an anisotropic etchant.

4. The method of claim 3, wherein the anisotropic etchant comprises tetramethyl ammonium hydroxide (TMAH).

5. The method of claim 1, wherein forming the fin comprises:
    masking a first portion of the substrate with a masking material, the masking leaving a second portion of the substrate exposed;
    recessing the second portion of the substrate, the recessing leaving the first portion as the fin, the recessing forming a plurality of elongate first trenches in a first part of the first sidewall of the fin, and the recessing forming a plurality of elongate second trenches in a first part of the second sidewall of the fin, the plurality of elongate first trenches and the plurality of elongate second trenches being co-planar and extending along the length of the fin; and
    wherein a second part of the first sidewalls comprise the one or more elongate first sidewall protrusions, and a second part of the second sidewalls comprise the one or more elongate second sidewall protrusions.

6. The method of claim 5, wherein the recessing comprises a plurality of etching cycles, wherein at least one etching cycle of the plurality of etching cycles comprises:
    isotropically etching the second portion of the substrate, wherein the masking material over the first portion of the substrate partially protects the first portion of the substrate from the etching, and the isotropically etching forms one elongate first trench of the plurality of elongate first trenches and one elongate second trench of the plurality of elongate second trenches;
    depositing a passivating material over the recessed second portion of the substrate and the one elongate first trench and the one elongate second trench; and
    selectively etching the passivating material from the second portion of the substrate, the selectively etching leaving the passivating material over the one elongate first trench and one elongate second trench to thereby prevent further etching of the one elongate first trench and one elongate second trench in one or more subsequent etching cycles.

7. The method of claim 6, wherein the isotropically etching comprises a plasma etching process.

8. The method of claim 5, wherein the fin has a width $W_1$ and the plurality of elongate first trenches and plurality of elongate second trenches have a width $W_2$ larger than width $W_1$ so that the anisotropically etching forms the one or more nanowires vertically separated from the substrate and from one or more other nanowires.

9. The method of claim 5, wherein the fin has a width $W_1$ and the plurality of elongate first trenches and plurality of elongate second trenches have a width $W_2$ smaller than width $W_1$ so that the anisotropically etching forms the one or more nanowires vertically contacting the substrate and vertically contacting one or more other nanowires.

10. The method of claim 1, wherein the one or more nanowires comprise a plurality of nanowires and the forming the fin comprises:
    forming at least one first material layer and at least one second material layer above the substrate;
    etching a plurality of trenches through the at least one first material layer and at least one second material layer, the etching resulting in the fin, and the fin having a plurality of first material sidewalls and a plurality of second material sidewalls; and
    forming the elongate first sidewall protrusions and elongate second sidewall protrusions along the plurality of first material sidewalls.

11. The method of claim 10, wherein forming the elongate first sidewall protrusions and elongate second sidewall protrusions comprises epitaxially growing the first material on the plurality of first material sidewalls.

12. The method of claim 11, wherein the epitaxially growing results in the elongate first sidewall protrusions and elongate second sidewall protrusions having one or more exterior surfaces defined by a (111) crystallographic plane.

13. The method of claim 10, further comprising selectively laterally etching a portion of the plurality of second material sidewalls prior to forming the elongate first sidewall protrusions and elongate second sidewall protrusions, the laterally etching undercutting the plurality of first material sidewalls and exposing inner portions of the at least one second material layer.

14. The method of claim 13, further comprising depositing a passivating material, the passivating material covering the exposed inner portions of the at least one second material layer, and the passivating material preventing epitaxial growth of the first material on the at least one second material layer.

15. The method of claim 14, wherein the depositing comprises atomic layer deposition (ALD) of the passivating material.

16. The method of claim 15, wherein a portion of the passivating material extends beyond the first material sidewalls of the fin, and the method further comprises selectively etching the portion of the passivating material extending beyond the first material exterior sidewalls.

17. The method of claim 10, wherein the at least one fin has a width W and the at least one first material layer has a thickness T smaller than width W so that the anisotropically etching forms at least two nanowires, the at least two nanowires being separated and substantially horizontally aligned.

18. The method of claim 10, wherein the at least one fin has a width W and the at least one first material layer has a thickness T larger than width W so that the anisotropically etching forms at least two nanowires, the at least two nanowires being substantially horizontally aligned and in contact with each other.

19. The method of claim 10, wherein the first material layer comprises silicon-germanium and the second material layer comprises silicon.

* * * * *